United States Patent
Kawano et al.

(10) Patent No.: US 10,969,335 B2
(45) Date of Patent: Apr. 6, 2021

(54) TERAHERTZ WAVE DETECTION DEVICE AND ARRAY SENSOR

(71) Applicant: Tokyo Institute of Technology, Tokyo (JP)

(72) Inventors: Yukio Kawano, Tokyo (JP); Daichi Suzuki, Tokyo (JP)

(73) Assignee: Tokyo Institute of Technology, Tokyo (JP)

(*) Notice: Subject to any disclaimer, the term of this patent is extended or adjusted under 35 U.S.C. 154(b) by 345 days.

(21) Appl. No.: 16/095,771

(22) PCT Filed: Apr. 28, 2017

(86) PCT No.: PCT/JP2017/016947
§ 371 (c)(1),
(2) Date: Oct. 23, 2018

(87) PCT Pub. No.: WO2017/188438
PCT Pub. Date: Nov. 2, 2017

(65) Prior Publication Data
US 2021/0010932 A1    Jan. 14, 2021

(30) Foreign Application Priority Data
Apr. 28, 2016  (JP) ................. JP2016-091298

(51) Int. Cl.
*G01J 3/42*  (2006.01)
*G01J 5/04*  (2006.01)
(Continued)

(52) U.S. Cl.
CPC ............ *G01N 21/3586* (2013.01); *G01J 3/42* (2013.01); *G01J 5/046* (2013.01); *H01L 51/0048* (2013.01)

(58) Field of Classification Search
CPC ........ G01J 3/42; G01J 5/046; G01N 21/3586; H01L 51/0048
See application file for complete search history.

(56) References Cited

U.S. PATENT DOCUMENTS 9,012,845 B2 *  4/2015  Kaufman ............... G01J 1/44
                                              250/338.1
2008/0089829 A1*  4/2008  Ganapathiraman .... B82Y 30/00
                                              423/447.3
2011/0315880 A1  12/2011  Nemirovsky

FOREIGN PATENT DOCUMENTS

JP   B_0003981738   9/2007
JP   A_2007-311442  11/2007
(Continued)

OTHER PUBLICATIONS

International search report and Written Opinion received in connection with international application No. PCT/JP2017/016947, dated Apr. 3, 2018.(with Eng. Translation).
(Continued)

*Primary Examiner* — Mark R Gaworecki
(74) *Attorney, Agent, or Firm* — The Marbury Law Group, PLLC

(57) ABSTRACT

A terahertz wave detection device includes a low-dimensional electron system material formed on a substrate; and a first electrode and a second electrode opposingly arranged on a two-dimensional plane of the low-dimensional electron system material. The first electrode and the second electrode are made of metals having different thermal conductivity. An 8-element array sensor includes eight terahertz wave detection devices aligned in an array. The terahertz wave detection device includes carbon nanotube film; a first electrode disposed on one side of the carbon nanotube film; and a second electrode disposed on the other side of the carbon
(Continued)

nanotube film. The first electrode and the second electrode have different thermal conductivity.

10 Claims, 16 Drawing Sheets

(51) Int. Cl.
  *G01N 21/35* (2014.01)
  *H01L 51/00* (2006.01)
  *G01N 21/3586* (2014.01)

(56) References Cited

FOREIGN PATENT DOCUMENTS

| JP | A_2010060284 | 3/2010 |
| JP | 2015-179183 A | 10/2015 |
| WO | WO 2011/024561 A1 | 3/2011 |
| WO | WO 2016/039022 A1 | 3/2016 |

OTHER PUBLICATIONS

Kawano, "Terahertz Detectors, Spectrometers, and Imagers based on Low-dimensional Electron Systems", Oyo Buturi, vol. 84, No. 7, (2015) (in Japanese).

He et al., "Carbon Nanotube Terahertz Detector", Nano Letters, (2014), pp. 3953-3958.

Kawano, "Terahertz Response of Carbon Nanotubes and Graphene", J. of the Physical Society of Japan, vol. 84 (2015), 121010.

Suzuki et al., "A Flexible and Wearable Terahertz Scanner" Nature Photonics, vol. 10, No. 12, (2016) pp. 809-813.

Wang et al., "Terahertz Response of Carbon Nanotube/Metal Hetero Junctions", 38th Conference on Infrared, Millimeter and Terahertz Waves (IRMMW-THz), IEEE 2013 (doi: 10.1109/IRMMW-THz.2013.6665664).

Erikson et al., "Figure of Merit for Carbon Nanotubes Photothermoelectric Detectors", ACS Nano, vol. 9, No. 12, (2015), pp. 11618-11627.

\* cited by examiner

TERAHERTZ WAVE DETECTION DEVICE AND ARRAY SENSOR

RELATED APPLICATIONS

This application is a national phase entry of international patent application PCT/JP2017/016947 filed Apr. 28, 2017, which claims benefit of priority to Japanese Application Serial No. 2016-091298, filed Apr. 28, 2016, the entire disclosures of which are incorporated herein by reference in their entireties.

TECHNICAL FIELD

The invention relates to a terahertz wave detection device and an array sensor.

BACKGROUND ART

Terahertz (THz) waves mean electromagnetic waves within a region of frequency of 0.1 to 30 THz (1 THz=$10^{12}$ Hz), the region including submillimeter waves and far-infrared rays having a wavelength of 0.01 mm to 3 mm.

The terahertz waves have been unexplored because they are the higher frequency limit electronically controllable in electronics and also are the lower energy limit optically controllable in optics or photonics. For the terahertz waves, basic elements such as a light source and a detection unit are thus unexplored yet as compared to other frequency bands. Since the terahertz wave has a wavelength that is longer than that of visible light by two or three digits, the terahertz wave has a characteristic in which its spatial resolution for imaging is low.

Patent Literature 1 discloses a terahertz light detection device including a semiconductor chip in which a two-dimensional electron gas is formed within a certain range from the surface, and a carbon nanotube, a conductive source electrode, a conductive drain electrode, and a conductive gate electrode that are provided in close contact with the surface. The carbon nanotube extends along the surface of the semiconductor chip while its two ends are respectively connected to the source electrode and the drain electrode, and the gate electrode is located at a certain distance from a side surface of the carbon nanotube. The terahertz light detection device further includes an SD current detection circuit that detects an SD current between the source electrode and the drain electrode by applying a predetermined voltage between the electrodes, a gate voltage application circuit that applies a variable gate voltage between the source electrode and the gate electrode, and a magnetic field generation device that applies a variable magnetic field to the semiconductor chip.

For example, Non-patent Literatures 1 to 4 disclose detection units that can detect frequency of the terahertz wave. Non-patent Literatures 3 and 4 disclose detection units that can select frequency. Since the conventional THz detection unit excites one conduction electron by absorbing one photon, the detection sensitivity has been inevitably limited.

In contrast, Non-patent Literature 4 discloses a new THz wave detection, spectrometry, and imaging technique, which uses functions of a low-dimensional electron system including a carbon nanotube (CNT) array, a graphene, and a semiconductor hetero interface two-dimensional electron gas (2DEG). Non-patent Literature 4 discloses a new mechanism created with a hybrid structure in which carbon nanotube (CNT) quantum dots and the two-dimensional electron gas in the semiconductor are joined together and configured to read carriers excited in the two-dimensional electrons with a sensitive charge sensor made of the CNT.

CITATION LIST

Patent Literature

Patent Literature 1: Japanese Patent Application Publication No. 2010-060284

Non-Patent Literatures

Non-patent Literature 1: Xiaowei He, Naoki Fujimura, J. Meagan Lloyd, Kristopher J. Erickson, A. Alec Talin, Qi Zhang, Weilu Gao, Qijia Jiang, Yukio Kawano, Robert H. Hauge, Francois Leonard and Junichiro Kono, "Carbon Nanotube Terahertz Detector," Nano Letters 14, 3953-3958 (2014)

Non-patent Literature 2: Kristopher Erickson, Xiaowei He, A. Alec Talin, Bernice Mills, Robert H. Hauge, Takashi Iguchi, Naoki Fujimura, Yukio Kawano, Junichiro Kono, Francois Leonard, "Figure of Merit for Carbon Nanotube Photothermoelectric Detectors," ACS Nano 9, 11618-11627 (2015)

Non-patent Literature 3: Yukio Kawano, "Terahertz Response of Carbon Nanotubes and Graphene," Journal of the Physical Society of Japan 84, 121010-1-9 (2015)

Non-patent Literature 4: Yukio Kawano, "Terahertz detectors, spectrometers, and imagers based on low-dimensional electron systems," membership journal of The Japan Society of Applied Physics "OYO BUTURI" Vol. 84, pp. 643-647 (2015)

SUMMARY OF INVENTION

Technical Problem

Non-patent literatures 1 to 4 have a problem that the optimum conditions for materials and electrodes are not identified in the case of a terahertz detection unit and an array sensor using the carbon nanotubes.

The invention was made in view of such a circumstance and has an object to provide a terahertz detection unit and an array sensor with improved detection sensitivity that can observe an accurate image.

Solution to Problem

To solve the above problems, a first terahertz wave detection device according to the invention includes a low-dimensional electron system material formed on a substrate and a first electrode and a second electrode opposingly arranged on a two-dimensional plane of the low-dimensional electron system material, in which the first electrode and the second electrode are made of metals having different thermal conductivity.

An array sensor according to the invention includes the terahertz wave detection devices aligned in an array, in which the array sensor radiates a THz wave onto a surface of the low-dimensional electron system material and detects carriers that are THz excited in the low-dimensional electron.

A second terahertz wave detection device according to the present invention includes a carbon nanotube film and a first electrode arranged on one side of the carbon nanotube film and a second electrode arranged on the other side of the carbon nanotube film, in which the first electrode and the second electrode have different or the same thermal conductivity.

Advantageous Effects of Invention

According to the present invention, it is possible to provide a terahertz detection unit with improved detection sensitivity that can observe an accurate image.

BRIEF DESCRIPTION OF DRAWINGS

FIGS. 6A, 6B and 6C include diagrams that illustrate I-V characteristics and results of THz response of the terahertz wave detection device according to the embodiment, in which FIG. 6A illustrates shifting observation of the I-V characteristic when THz irradiation of 0.14 THz occurs, FIG. 6B illustrates shifting observation of the I-V characteristic when THz irradiation of 14 THz occurs, and FIG. 6C illustrates shifting observation of the I-V characteristic when THz irradiation of 30 THz occurs.

FIGS. 9A and 9B include diagrams that illustrate I-V characteristics and results of THz response of the terahertz wave detection device of a comparative example and the embodiment, in which FIG. 9A illustrates the comparative example that the same kind of metal (Au—Au) is used for a first electrode (source electrode) and a second electrode (drain electrode), and FIG. 9B illustrates an example that Au with high thermal conductivity is used for the first electrode (source electrode) and Ti with low thermal conductivity is used for the second electrode (drain electrode).

FIGS. 11A and 11B include diagrams that describe a method of observation using the measurement system in FIG. 10, in which FIG. 11A is a diagram of a sample seen from below, and FIG. 11B is a diagram that illustrates an observed image of THz transmitted light.

FIGS. 12A and 12B include diagrams that describe an example of observing another sample using the measurement system in FIG. 10, in which FIG. 12A is a diagram of the sample seen from below, and FIG. 12B is a diagram that illustrates an observed image of THz transmitted light.

FIGS. 13A, 13B and 13C include diagrams that illustrate an overall configuration of a measurement system of the terahertz wave detection device according to the embodiment, in which FIG. 13A is an example of the overall configuration of the measurement system, FIG. 13B is an example of a bent mask, and FIG. 13C is an example of an observed two-dimensional image.

FIGS. 14A and 14B include diagrams that illustrate an application example of arranging a 23-element array sensor of the terahertz wave detection device according to the embodiment on a flexible board, in which FIG. 14A is an example of wrapping a flexible board on which the 23-element array sensor is arranged on a hand, and FIG. 14B is a diagram that illustrates an observed image of THz transmitted light.

DESCRIPTION OF EMBODIMENTS

Hereinafter, embodiments of the present invention will be described in detail with reference to the drawings.

Figure 1A:
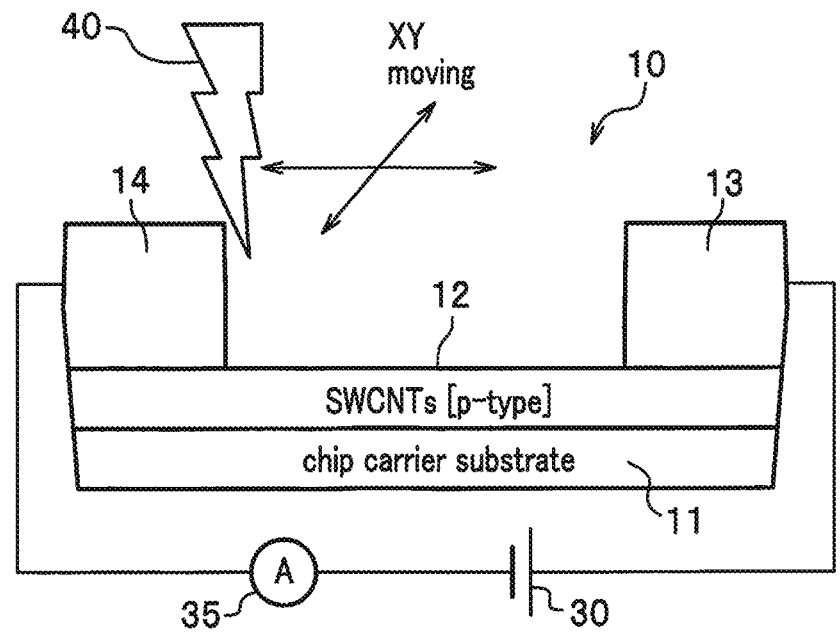
FIG. 1A is a diagram that illustrates a configuration of a terahertz wave detection device according to an embodiment of the present invention.
Figure 1B:
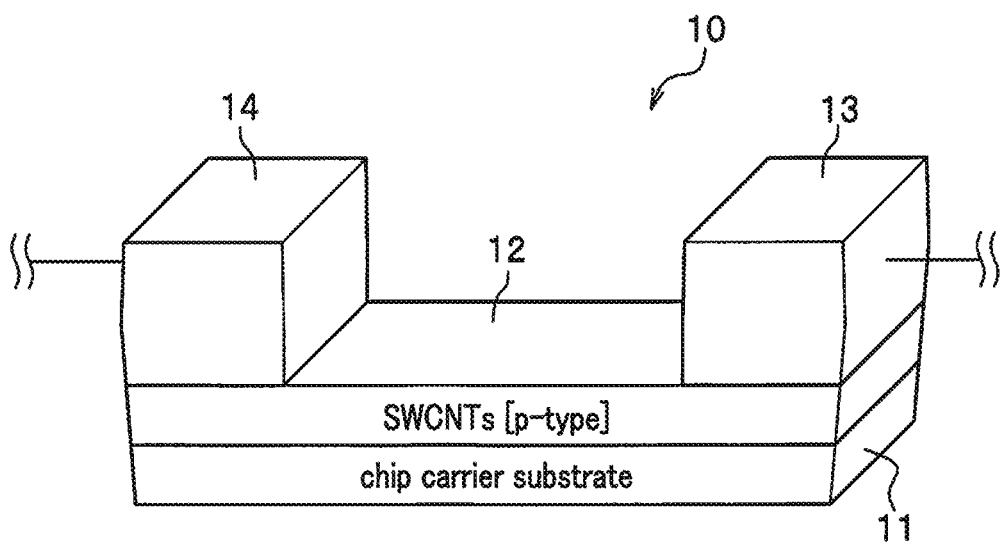
FIG. 1B is a perspective view of the terahertz wave detection device.

FIG. 1A is a diagram that illustrates a configuration of a terahertz wave detection device according to one embodiment of the present invention, and FIG. 1B is a perspective view of the terahertz wave detection device.

The terahertz wave detection device of this embodiment provides the optimum conditions of materials and electrodes.

As illustrated in FIGS. 1A and 1B, a terahertz wave detection element 10 (terahertz wave detection device) includes a single-walled carbon nanotubes film (SWCNTs film) 12 (low-dimensional electron system material) accurately oriented in the horizontal direction on a chip carrier substrate 11, a first electrode 13 having a first thermal conductivity on one end of the single-walled carbon nanotubes film 12, and a second electrode 14 having a second thermal conductivity on the other end of the single-walled carbon nanotubes film 12.

That is, the terahertz wave detection element 10 includes the single-walled carbon nanotubes film 12 formed on the chip carrier substrate 11 and the first electrode 13 and the second electrode 14 opposingly arranged on a two-dimensional plane of the single-walled carbon nanotubes film 12, in which the first electrode 13 and the second electrode 14 are made of metals having different thermal conductivity. The chip carrier substrate 11 may be made of any material.

A battery 30 and an ammeter 35 are connected between the first electrode 13 and the second electrode 14. Since a positive side of the battery 30 is the first electrode 13 in FIGS. 1A and 1B, the first electrode 13 is called a source electrode and the second electrode 14 is called a drain electrode in some cases.

The single-walled carbon nanotubes film 12 between the first electrode 13 and the second electrode 14 is irradiated with a THz wave 40 of an infrared ray region (IR irradiation).

Figure 2A:
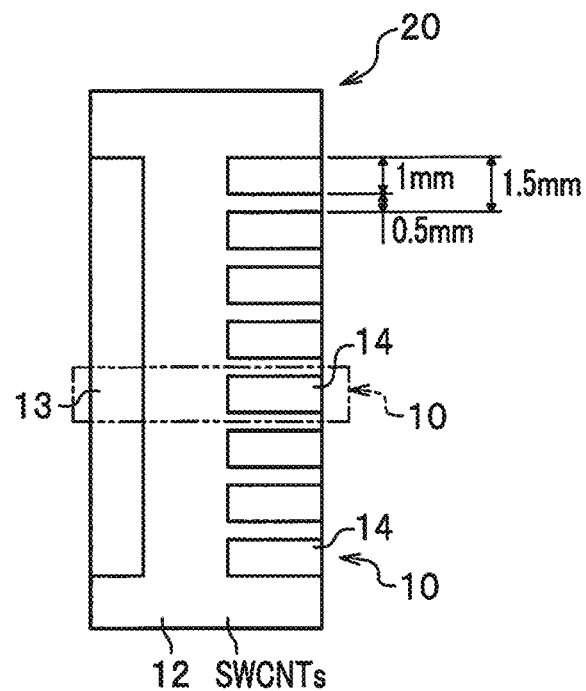
FIG. 2A is a diagram that illustrates an exterior of an 8-element array sensor of the terahertz wave detection device according to the embodiment.
Figure 2B:
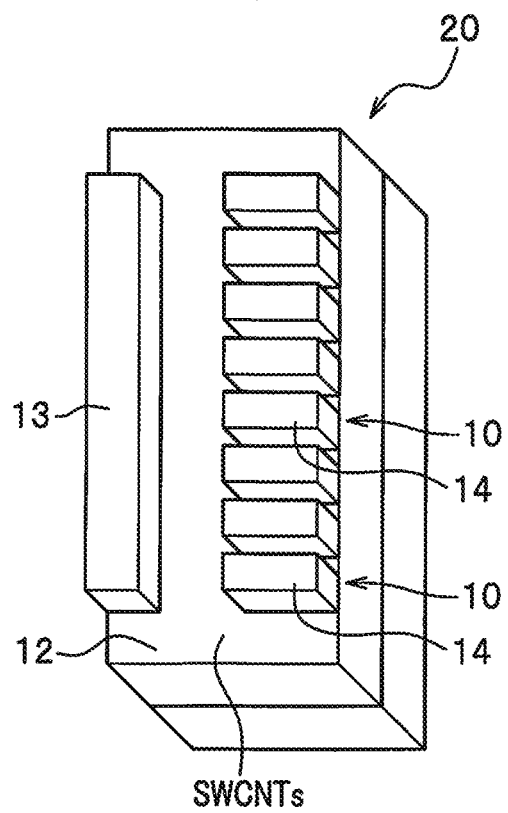
FIG. 2B is a perspective view of the 8-element array sensor.

FIG. 2A is a diagram that illustrates an exterior of an 8-element array sensor, and FIG. 2B is a perspective view of the 8-element array sensor.

As illustrated in FIGS. 2A and 2B, an 8-element array detector 20 includes eight terahertz wave detection elements 10 aligned in an array. When the 8-element array sensor is stored in a small package for use, the small package is desirably vacuum locked, but the small package may not be vacuum locked. The 8-element array sensor 20 includes the eight terahertz wave detection elements 10 each having 1 mm width and being aligned at 0.5 mm intervals. In FIG. 2A, a longitudinal length of the terahertz wave detection element 10 of FIGS. 1A and 1B is 1 mm, and an interval between the electrodes between one terahertz wave detection element 10 and the other terahertz wave detection element 10 is 1.5 mm. THz detection can be made in a two-dimensional area of 8×8 by moving the 8-element array sensor 20 in either of an X direction and a Y direction.

The 8-element array sensor 20 radiates the THz wave onto a surface of the single-walled carbon nanotubes film 12 of the terahertz wave detection element 10 and detects carriers that are THz excited in the low-dimensional electron.

<Single-Walled Carbon Nanotubes Film>

Carbon nanotubes have high electric conductivity and high flexibility with high mechanical strength. The carbon nanotubes absorb electromagnetic waves of an extremely wide frequency band including a region between frequency close to DC and ultraviolet light. Particularly, the carbon nanotubes can absorb light of an extremely large frequency band from sub-terahertz to ultraviolet. The inventors previously indicated that the carbon nanotubes can be used for the terahertz wave detection device; however, the optimum conditions of the materials and the electrodes were unknown. This embodiment provides the optimum conditions of the materials and the electrodes. First, the carbon nanotube as the material has following characteristics.

The single-walled carbon nanotubes film 12 is densely oriented such that the length direction is along ends of the first electrode 13 and the second electrode 14. Further accurate orientation is desired for improving the detection sensitivity.

As an example, the single-walled carbon nanotubes film 12 is p-type. Otherwise the single-walled carbon nanotubes film 12 may be n-type or a combination of the p-type and the n-type.

The single-walled carbon nanotubes film 12 is a carbon nanotube thin film having a film thickness of 50 µm, for example.

Other than the above-mentioned single-walled carbon nanotubes film, the low-dimensional electron system material may be a graphene (described later) and a semiconductor hetero interface two-dimensional electron gas (2DEG).

<First Electrode and Second Electrode>

The first electrode 13 (source electrode) and the second electrode 14 (drain electrode) are made of metals. Metals that the inventors used for the electrodes are Au, Al, Mo, Ni, and Ti. However, it may be considered that a noble metal other than Au such as Cu, Ag, and Pt, an aluminum group element other than Al such as Ga and In, a chromium group element other than Mo such as Cr and W, an iron group element other than Ni such as Fe and Co, a tin group element other than Ti such as Zr, Sn, Hf, Pb, and Th, a magnesium group element such as Be, Mg, and Zn, and an alloy of these metals can be used.

The first electrode 13 (source electrode) and the second electrode 14 (drain electrode) are made of metals having asymmetric thermal conductivity. The thermal conductivity (degree of thermal conductivity) is a value obtained by dividing an amount of heat flowing through a unit area that is perpendicular to the heat flow per unit time by a temperature difference (temperature gradient) per unit length. The electrodes are made of different materials to provide a difference of the thermal conductivity between the electrodes.

The difference of the thermal conductivity between the first electrode 13 and the second electrode 14 is preferred to be large (equal to or more than a predetermined difference) (described later). Among the electrode materials indicated in FIG. 3, a combination of (Au, Al) and (Mo, Ni, Ti) makes large thermal conductivity of the electrode.

For example, an asymmetric electrode structure of the electrode thermal conductivity is implemented by using Au with high thermal conductivity for the first electrode 13 (source electrode) and using Ti with low thermal conductivity for the second electrode 14 (drain electrode). In this case, Au and Ti may be replaced with each other between the first electrode 13 and the second electrode 14.

As an example, the length direction of the single-walled carbon nanotubes film between the first electrode 13 and the second electrode 14 is 1.5 mm, and an interval between the end of the first electrode 13 and the end of the second electrode 14 is 20 mm.

Figure 3:
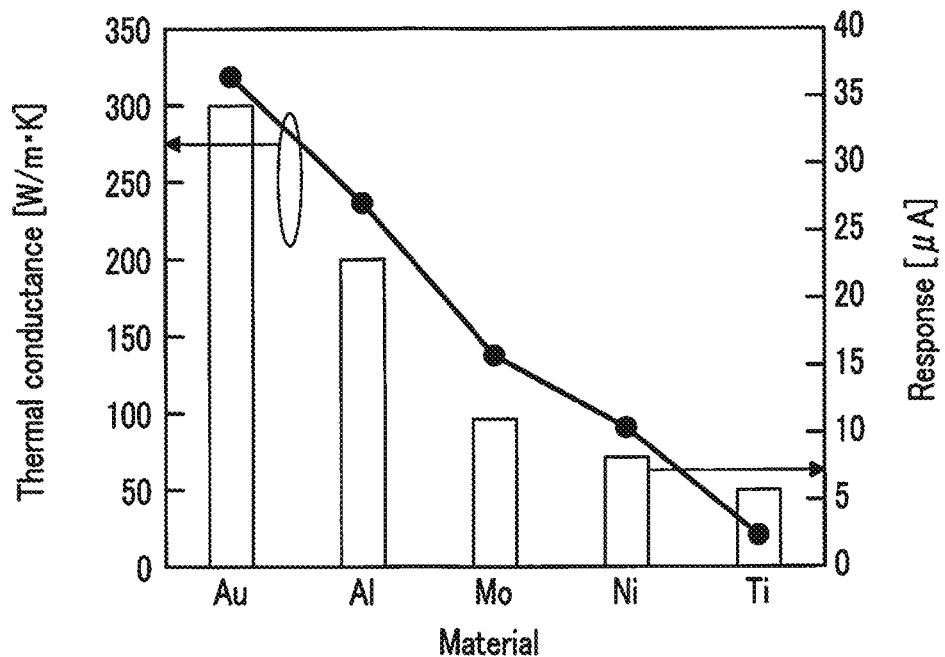
FIG. 3 is a diagram that illustrates thermal conductivity and sensitivity of electrode materials (Au, Al, Mo, Ni, and Ti) of the terahertz wave detection device according to the embodiment.

FIG. 3 is a diagram that illustrates thermal conductivity [W/m·K] and response signals [µA] (right vertical axis) of the electrode materials (Au, Al, Mo, Ni, and Ti). The response signals [µA] are indicated as response currents. In FIG. 3, the thermal conductivity of the electrode materials is indicated by a line graph (left vertical axis) and the response signals are indicated by a bar graph (right vertical axis).

As illustrated in FIG. 3, the response current [µA] of each electrode has sensitivity of a different value in the order of Au>Al>Mo>Ni>Ti. Among the electrode materials indicated in FIG. 3, Au has the largest response current, and second is Al. Then the sensitivity drops by almost half from Al followed by Mo, Ni, and Ti.

The above-described sensitivity relates to the thermal conductivity. That is, as illustrated in FIG. 3, the higher the thermal conductivity, the higher the sensitivity.

The detection sensitivity can be improved by increasing the electrode thermal conductivity.

Figure 4:
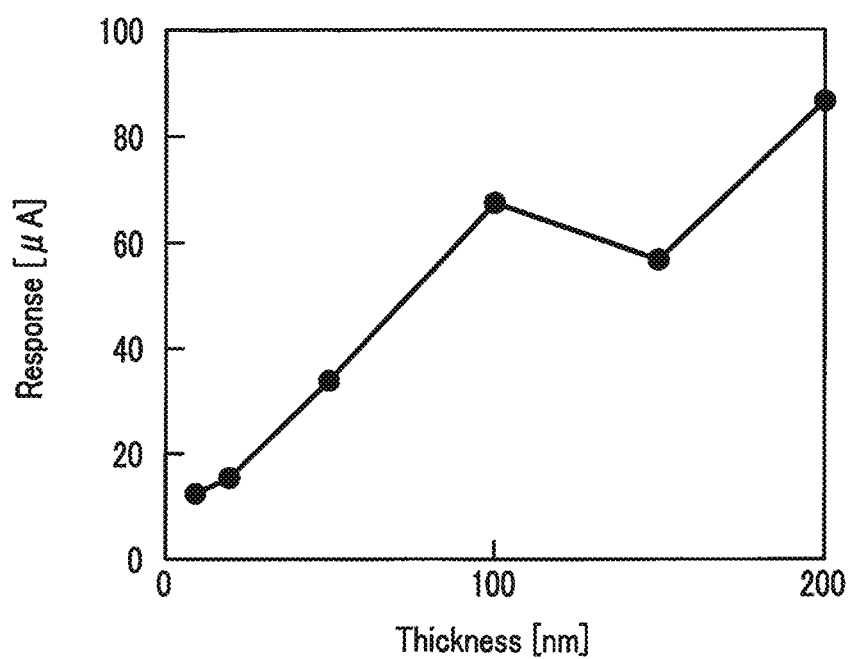
FIG. 4 is a diagram that illustrates a relationship of response sensitivity and thickness of the electrode of the terahertz wave detection device according to the embodiment.

FIG. 4 is a diagram that illustrates a relationship of the response signal (response current) [µA] and thickness of the electrode [nm].

As illustrated in FIG. 4, the thicker the electrode, the higher the sensitivity. The response signal is increased by making the electrode thicker.

As described above, in terms of using metals with asymmetric thermal conductivity, among the electrode materials indicated in FIG. 3, the combination of (Au, Al) and (Mo, Ni, Ti) is used. In terms of improving the detection sensitivity, Au with high thermal conductivity can be selected. Thus, when Au is selected for one electrode, a metal out of (Mo, Ni, Ti) can be selected for the other electrode. In this case, it is better to use Ti for the other electrode in order to increase the difference of the thermal conductivity between the electrodes.

Figure 5:
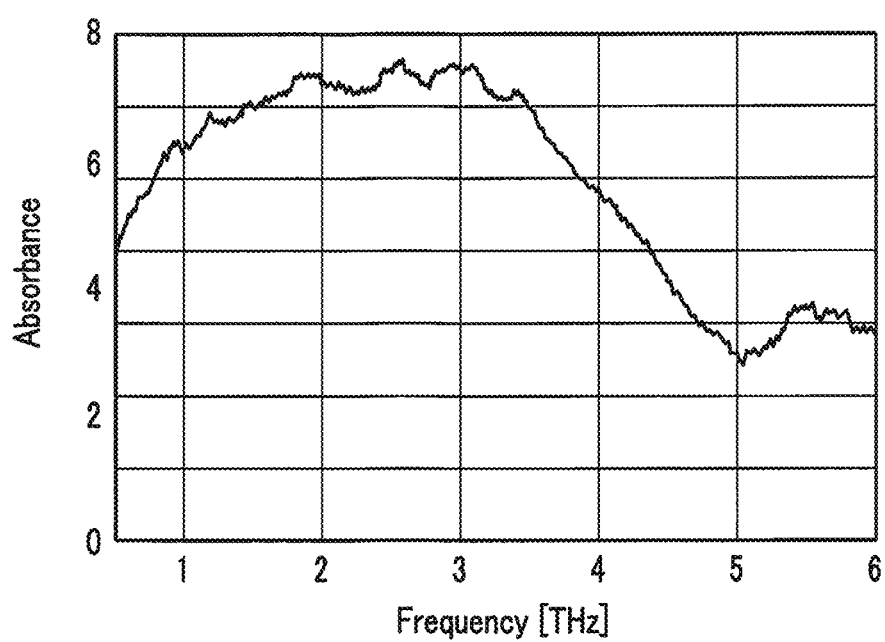
FIG. 5 is a diagram that illustrates an electromagnetic wave absorption spectrum of the terahertz wave detection device according to the embodiment.

FIG. 5 is a diagram that illustrates an electromagnetic wave absorption spectrum of the terahertz wave detection element 10 (single-walled carbon nanotubes film 12). The horizontal axis represents Frequency [THz] and the vertical axis represents electromagnetic wave absorbance.

As illustrated in FIG. 5, the terahertz wave detection element 10 can absorb the electromagnetic wave in a wide frequency band.

As described above, the single-walled carbon nanotubes film 12 is densely oriented as an array such that the length direction is along the ends of the first electrode 13 and the second electrode 14. That is, this is a case where an oscillating electric field of the electromagnetic wave is parallel to the length direction of the single-walled carbon nanotubes film 12 (CNT array). Thus, the single-walled carbon nanotubes film 12 can absorb the electromagnetic wave in a wide frequency band.

Figure 6A:
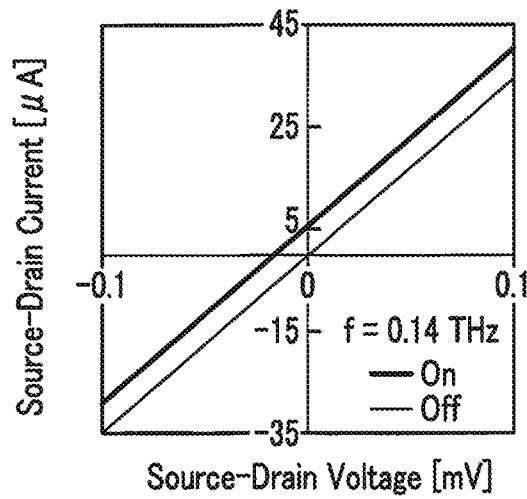
Figure 6B:
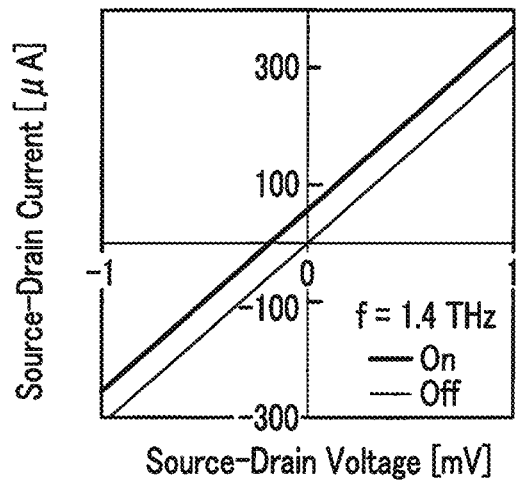
Figure 6C:
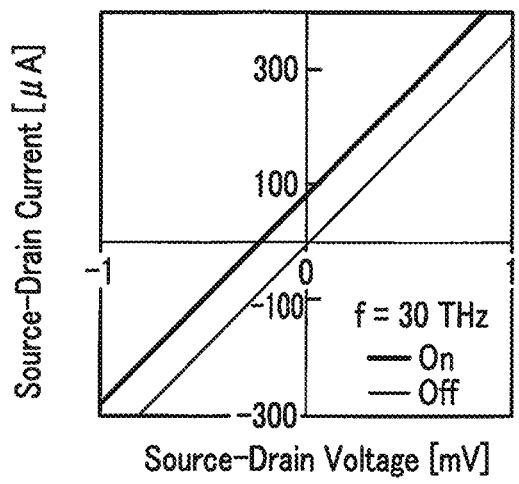

FIGS. 6A, 6B, and 6C include diagrams that illustrate I-V characteristics and results of THz response of the terahertz wave detection device 10 (under room temperature). The horizontal axis represents a source-drain voltage [mV] and the vertical axis represents a source-drain current [µA]. In FIGS. 6A, 6B, and 6C, a narrow solid line of the I-V characteristic indicates a case where no THz irradiation occurs (Off) and a bold solid line of the I-V characteristic indicates a case where THz irradiation occurs (On).

As illustrated in FIG. 6A, when there is THz irradiation of 0.14 THz, the I-V characteristic is linear, and shifting of the I-V characteristic is observed.

As illustrated in FIG. 6B, when there is THz irradiation of 1.4 THz, the I-V characteristic is linear, and shifting of the I-V characteristic is observed.

As illustrated in FIG. 6C, when there is THz irradiation of 30 THz, the I-V characteristic is linear, and shifting of the I-V characteristic is observed. Since every THz irradiation has no change in slope of the I-V characteristic (electric resistance is constant), this is not a simple bolometric effect (temperature rise effect due to THz absorption). It was found that the lower the thermal conductivity, the greater the THz response, by measuring dependency on the thermal conductivity of the substrate (chip carrier substrate 11) on which the single-walled carbon nanotubes film 12 (CNN array) is mounted. This fact means that the heat that is generated as a result of the THz irradiation is not released through the substrate and the THz response is increased the more the heat is accumulated in the CNT, and thus the photothermoelectric effect is expected as a THz detection mechanism.

Figure 7:
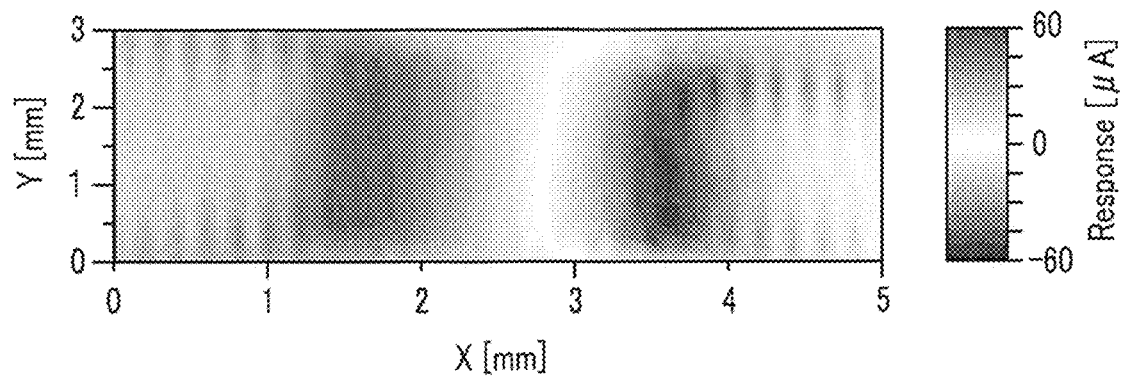
FIG. 7 is a diagram that illustrates sensitivity of an XY surface of a single-walled carbon nanotubes film of the terahertz wave detection device according to the embodiment.

FIG. 7 is a diagram that illustrates a response signal (response current) [µA] of an XY surface of the single-walled carbon nanotubes film 12. Darker-shaded areas in FIG. 7 is a part where the sensitivity is higher. On the actual screen, positive or negative and sensitivity of the response signal are detected and are displayed such that the left side of FIG. 7 and a positive side of the response signal [µA] indicate positive of the signal (e.g., red color) and the right side of FIG. 7 and a negative side of the response signal [µA] indicate negative of the signal (e.g., blue color), although they cannot be recognized on the drawing since FIG. 7 is monochrome. The sensitive parts are close to each electrode on two parts of the XY surface of the single-walled carbon nanotubes film 12. It was found that it is difficult to obtain accurate information for a structural reason because the sensitive parts are close to the electrodes. The inventors came up with an idea that the number of the sensitive part to be used may be one and it may be possible to obtain more accurate information if the sensitive part is located away from the electrodes. Thus, the asymmetric electrode structure is implemented by using metals with asymmetric thermal conductivity for the electrodes. For example, the above-described sensitive part is located away from either of the electrodes by using Au with high thermal conductivity for the one electrode and using Ti with low thermal conductivity for the other electrode. This makes it possible to obtain an accurate image by detecting a response from only one side.

Figure 8:
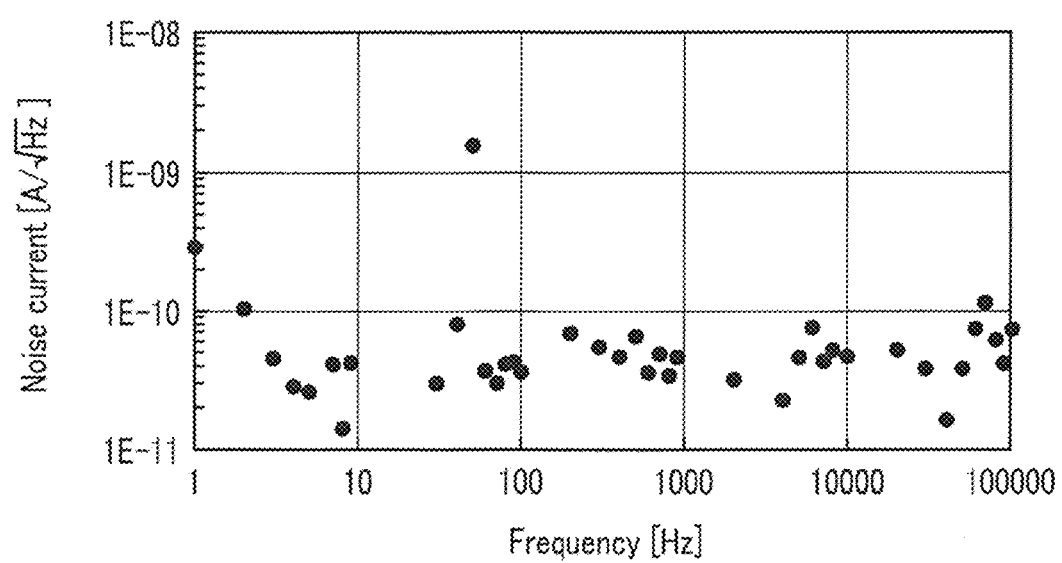
FIG. 8 is a diagram that illustrates noise equivalent powers of the terahertz wave detection device according to the embodiment.

FIG. 8 is a diagram that illustrates noise equivalent powers of the terahertz wave detection device 10.

As illustrated in FIG. 8, excellent detection sensitivity with noise equivalent powers of $10^{-10}$ to $10^{-11}$ A/Hz$^{1/2}$ could be obtained in the extremely wide frequency band including the region between frequency close to DC and ultraviolet light.

Figure 9A:
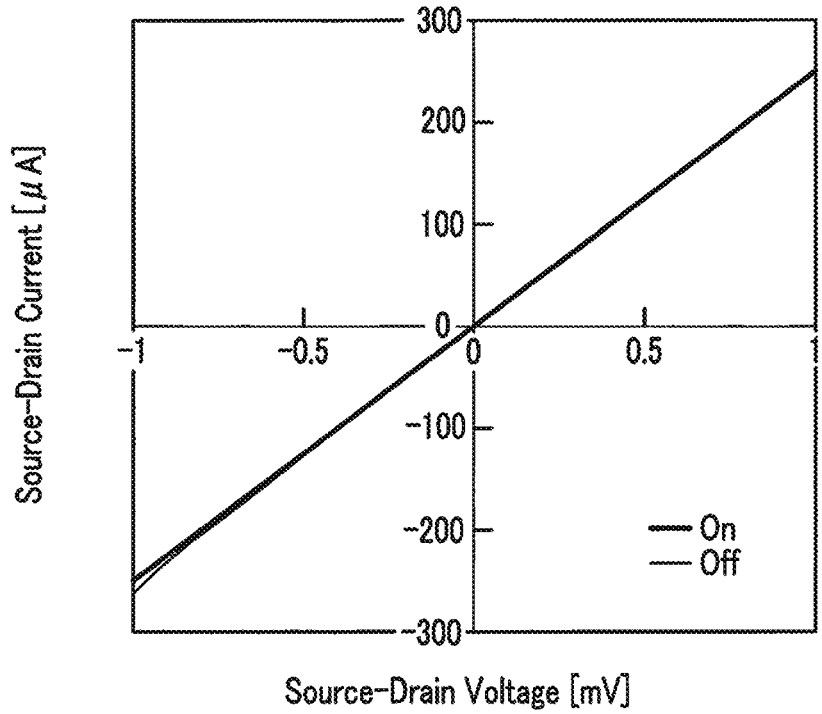
Figure 9B:
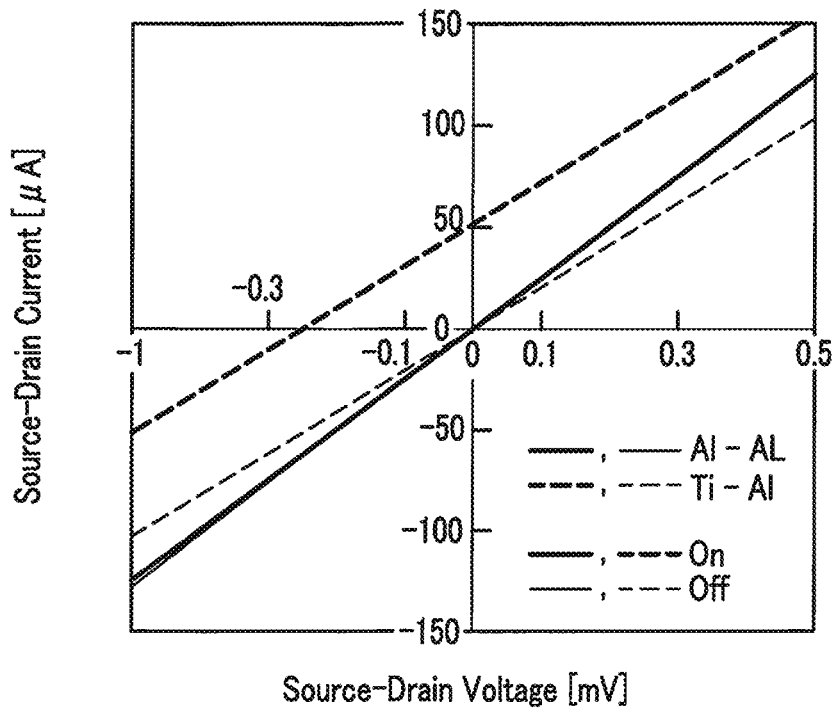

FIGS. 9A, 9B, and 9C include diagrams that illustrate I-V characteristics and results of THz response of the terahertz wave detection device 10 of a comparative example and the embodiment (under room temperature). The horizontal axis represents the source-drain voltage [mV] and the vertical axis represents the source-drain current [µA]. In FIGS. 9A, 9B, and 9C, a narrow solid line and a narrow broken line of the I-V characteristic indicate a case where no THz irradiation occurs (Off) and a bold solid line and a bold broken line of the I-V characteristic indicate a case where THz irradiation occurs (On).

FIG. 9A is a comparative example that the same kind of metal (Au—Au) is used for the first electrode 13 (source electrode) and the second electrode 14 (drain electrode).

As illustrated in FIG. 9A, in the comparative example, no shifting of the I-V characteristic due to the THz irradiation is observed.

FIG. 9B illustrates an example that Au with high thermal conductivity is used for the first electrode 13 (source electrode) and Ti with low thermal conductivity is used for the second electrode 14 (drain electrode).

As illustrated in FIG. 9B, with the THz irradiation, the I-V characteristic is linear, and shifting of the I-V characteristic is observed. Note that the shifting of the I-V characteristic becomes the greatest when (Au—Ti) is used.

Next, an example of measuring using the 8-element array sensor 20 that is made as a prototype based on the above-mentioned optimal values is described below.

Figure 10:
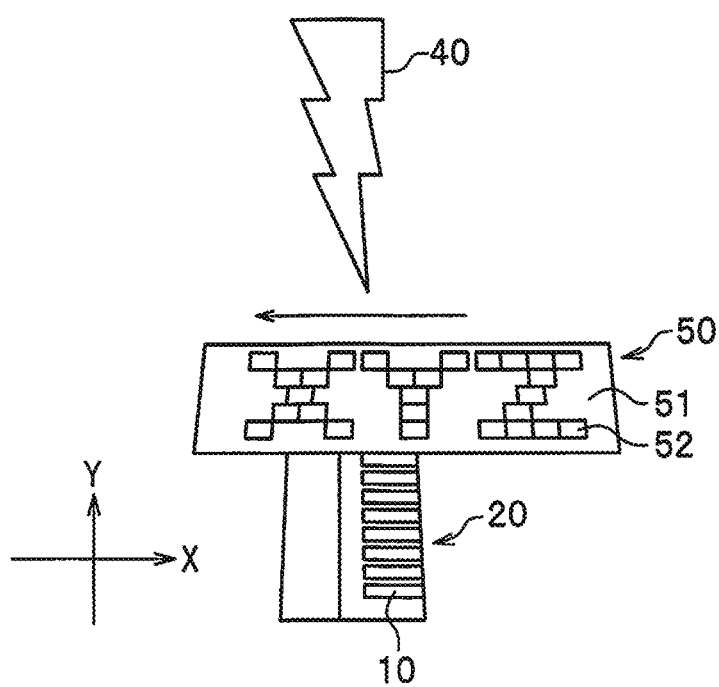
FIG. 10 is a diagram that illustrates an overall configuration of a measurement system of the terahertz wave detection device according to the embodiment.

FIG. 10 is a diagram that illustrates an overall configuration of a measurement system of the terahertz wave detection device.

As illustrated in FIG. 10, a metal mask 50 as a test object (sample) is irradiated with the Thz wave 40 of the infrared ray region from the above (IR irradiation). A light source of the THz is generated by a femtosecond laser and the like. The metal mask 50 is made by forming information 52 (in this case, letters X, Y, Z) on aluminum foil (non THz wave transmittable) 51 and superimposing a non-transparent (visible light) film (THz transmittable) on this aluminum foil 51 to be a mask.

The 8-element array sensor 20 is arranged under this metal mask 50, and the 8-element array sensor 20 is moved in the XY directions (two-dimensional motion) with respect to the metal mask 50.

Otherwise, as illustrated in FIG. 10, the 8-element array sensor 20 is mounted to be irradiated with the THz wave 40 of the infrared ray region from the above, and the metal mask 50 is moved in a direction of an arrow (→) in FIG. 10. That is, the 8-element array sensor 20 is moved and crossed in the one direction for observing the two-dimensional image.

Figure 11A:
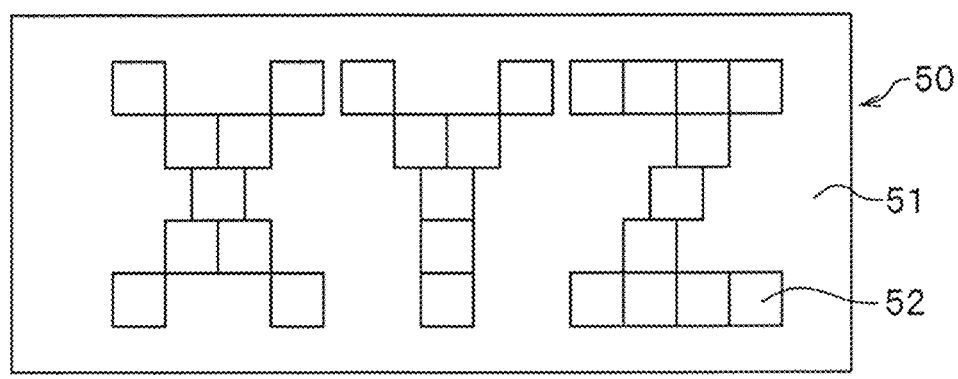
Figure 11B:
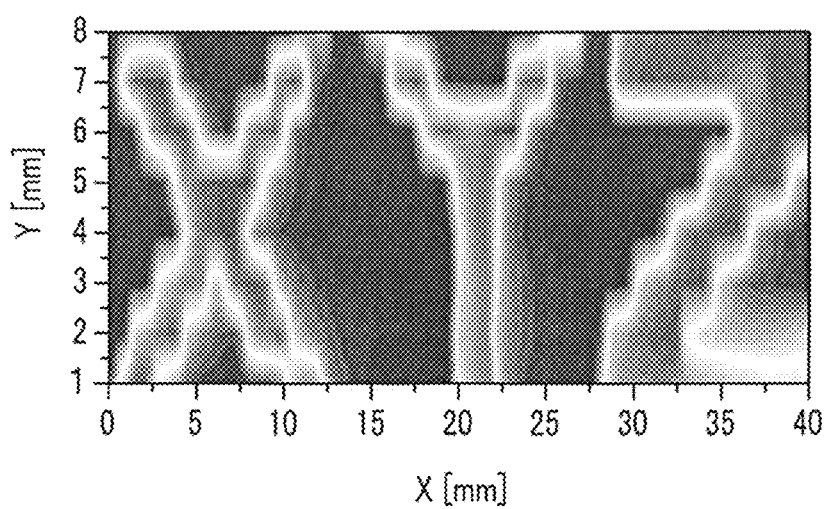

FIGS. 11A and 11B include diagrams that describe a method of observation using the measurement system in FIG. 10, in which FIG. 11A is a diagram of the sample seen from below, and FIG. 11B is a diagram that illustrates an observed image of THz transmitted light.

As illustrated in FIG. 11A, the metal mask 50 (sample) forms the letters 52 (X, Y, Z) on the aluminum foil 51 (e.g., the letter parts are cut off from the aluminum foil).

Figure 20:
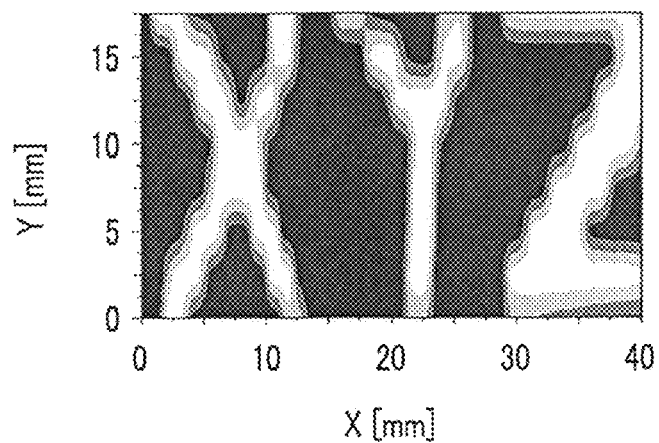
FIG. 20 is a diagram that illustrates another example 1 of an observed image of THz transmitted light.

As illustrated in FIG. 10, the 8-element array sensor 20 is moved in the one direction for observing the two-dimensional image. As illustrated in FIGS. 11B and 20, the letters 52 of the metal mask 50 could be observed with high sensitivity and high accuracy. Since the terahertz wave detection elements 10 are arrayed, it is possible to obtain the two-dimensional image merely by moving the 8-element array sensor 20 in the one direction. Thus, high-speed observation is possible.

Note that FIG. 20 is a diagram that illustrates another example 1 of an observed image of THz transmitted light.

Figure 12A:
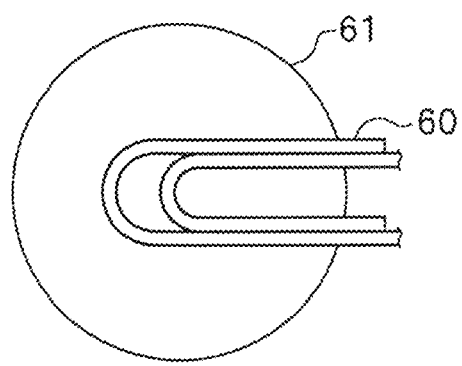
Figure 12B:
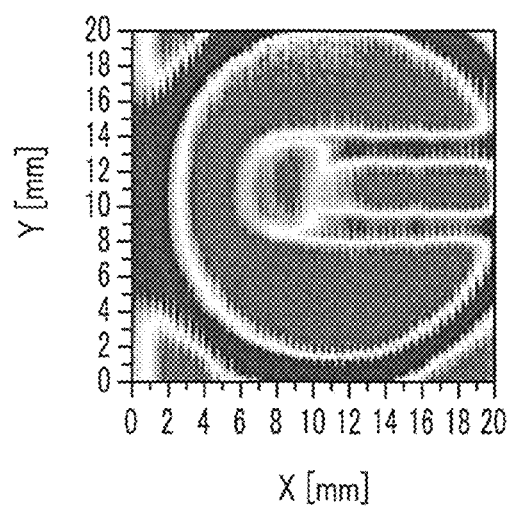

FIGS. 12A and 12B include diagrams that describe an example of observing another sample using the measurement system in FIG. 10, in which FIG. 12A is a diagram of the sample seen from below, and FIG. 12B is a diagram that illustrates an observed image of THz transmitted light.

As illustrated in FIG. 12A, a part of a clip (soft iron) 60 (sample) is covered by a circle Ge plate 61. In this case, Ge of the Ge plate 61 is THz wave transmittable. Fe of the clip 60 is non THz wave transmittable. From the above, the clip 60 (sample) is hidden by the Ge plate 61 and is thus invisible.

Figure 21:
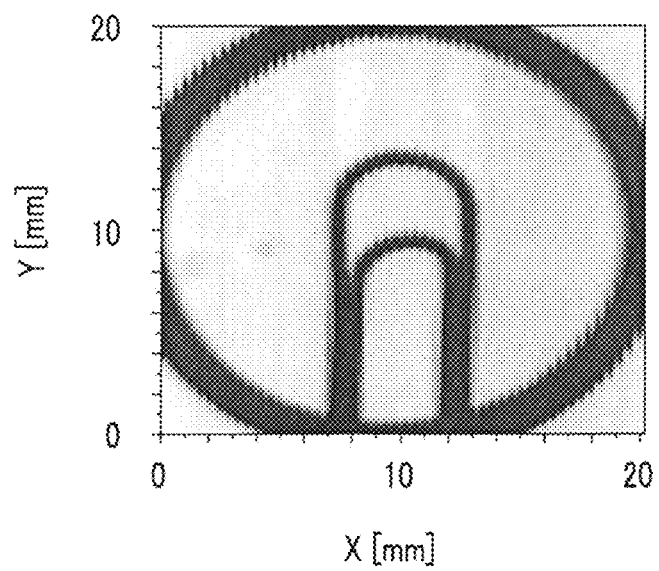
FIG. 21 is a diagram that illustrates another example 2 of an observed image of THz transmitted light.

As illustrated in FIG. 10, the two-dimensional image is observed by moving the 8-element array sensor 20 in the one direction. As illustrated in FIGS. 12B and 21, the clip 60 could be observed with high sensitivity and high accuracy. Since the terahertz wave detection elements 10 are arrayed, it is possible to obtain the two-dimensional image merely by moving and crossing the 8-element array sensor 20 in the one direction. Thus, high-speed observation is possible.

Note that FIG. 21 is a diagram that illustrates another example 2 of an observed image of THz transmitted light.

Figure 13A:
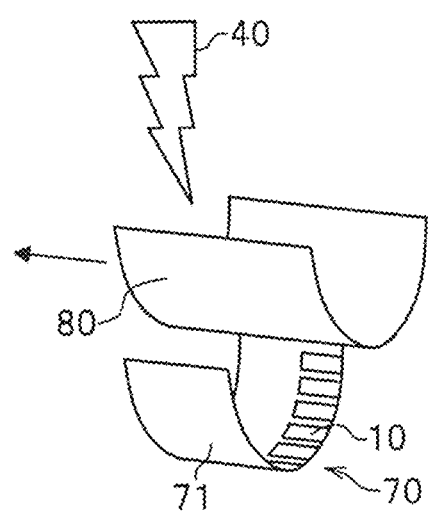
Figure 13B:
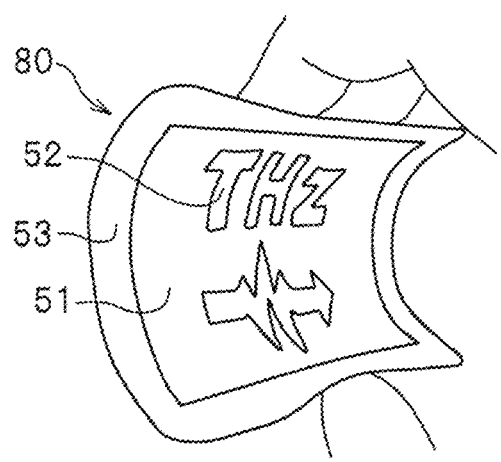
Figure 13C:
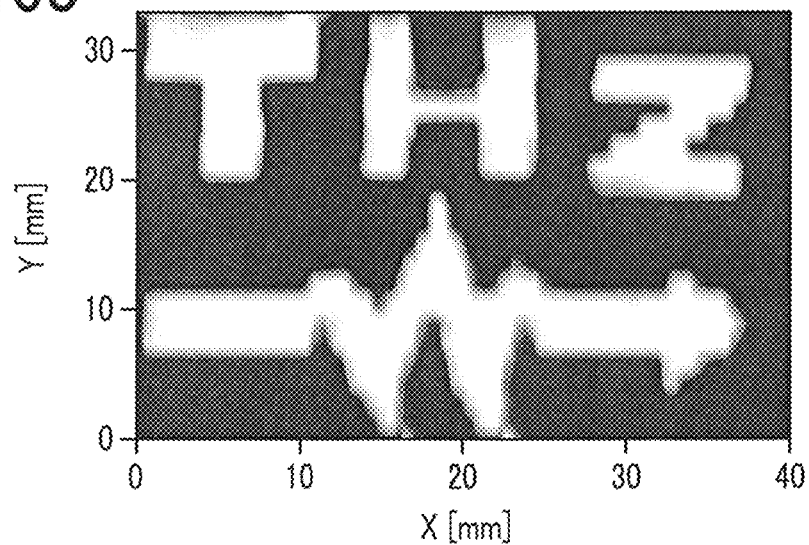

FIGS. 13A, 13B, and 13C include diagrams that illustrate an overall configuration of a measurement system of the terahertz wave detection device.

As illustrated in FIGS. 13A, 13B, and 13C, a 23-element array detector 70 includes 23 terahertz wave detection elements 10 aligned in an array on a flexible board 71. A material of the flexible board 71 may be anything such as a polyimide film. The single-walled carbon nanotubes film 12 (see FIGS. 1A and 1B) has both the high electric conductivity and mechanical strength and can be used for the flexible board 71 having flexibility. The 23-element array sensor 70 is a flexible sensor including 23 terahertz wave detection elements 10 each having 1 mm width and being aligned at 0.5 mm intervals on the flexible board 71. The 23-element array sensor 70 can be closely attached on a curved part on a living body such as a finger or an arm.

As illustrated in FIG. 13B, a flexible bent mask 80 is made by forming the information 52 (in this case, letters X, Y, Z and graphic) on the aluminum foil (non THz wave transmittable) 51 and superimposing a non-transparent (visible light) film (THz transmittable) on this aluminum foil 51.

The bent mask 80 (sample) is irradiated with the Thz wave 40 of the infrared ray region from the above (IR irradiation). A light source of the THz is generated by the femtosecond laser and the like.

As illustrated in FIG. 13A, the bent mask 80 (sample) is irradiated with the THz wave 40 of the infrared ray region from the above, and the bent mask 80 is moved in a direction of an arrow (→) for observing the two-dimensional image.

As illustrated in FIG. 13C, the letters and graphic 52 of the bent mask 80 could be observed with high sensitivity and high accuracy when observing the two-dimensional image by moving the bent mask 80 in the one direction. Since the terahertz wave detection elements 10 are arrayed, it is possible to obtain the two-dimensional image merely by moving the 23-element array sensor 70 in the one direction. Thus, high-speed observation is possible.

Figure 14A:
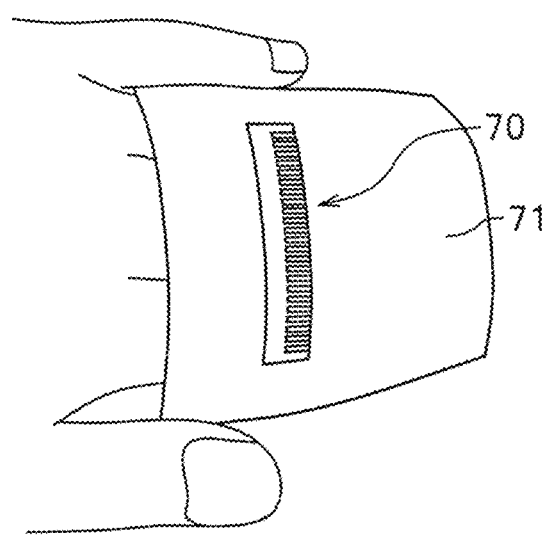
Figure 14B:
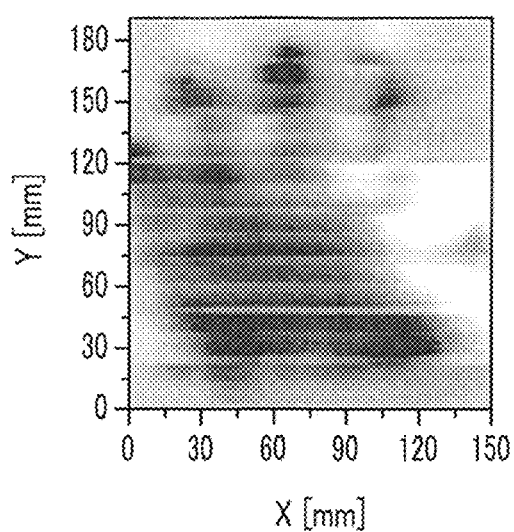

FIGS. 14A and 14B include diagrams that illustrate an application example of arranging the 23-element array sensor on the flexible board. FIG. 14A is an example of wrapping the flexible board 71 on which the 23-element array sensor 70 is arranged on a hand, and FIG. 14B is a diagram that illustrates an observed image of THz transmitted light.

As illustrated in FIGS. 14A and 14b, passive imaging of radiation from the hand with no external light source could be observed. This is expected as a first step for medical application.

As described above, the terahertz wave detection element 10 according to this embodiment includes the single-walled carbon nanotubes film 12 formed on the chip carrier substrate 11 and the first electrode 13 and the second electrode 14 opposingly arranged on the two-dimensional plane of the single-walled carbon nanotubes film 12, in which the first electrode 13 and the second electrode 14 are made of metals having different thermal conductivity. The difference of the thermal conductivity between the first electrode 13 and the second electrode 14 is preferred to be large (equal to or more than the predetermined difference).

In this way, the asymmetric electrode structure is implemented by using the metals with asymmetric thermal conductivity for the electrodes. For example, the sensitive part is away from either of the electrodes by using Au with high thermal conductivity for the first electrode 13 (source electrode) and using Ti with low thermal conductivity for the second electrode 14 (drain electrode). This makes it possible to obtain an accurate image by detecting a response from only one side.

The 8-element array sensor 20 includes an array in which the eight terahertz wave detection elements 10 aligned. THz detection in the two-dimensional area of 8×8 can be made by moving the 8-element array sensor 20 in either of the X and Y directions. Since the terahertz wave detection elements 10 are arrayed, it is possible to obtain the two-dimensional image merely by moving the 8-element array sensor 20 in the one direction and high-speed observation with high sensitivity and high accuracy is possible.

In this embodiment, improvement of the detection sensitivity is confirmed by changing types and thickness of the electrodes. Imaging measurement using multi-elements allows an image that is not visible with visible light to be visible.

In addition, image measurement of a region between sub-terahertz and infrared can be made by a single camera. Although the image measurement of 1 to 30 THz is possible for now, the image measurement of sub THz to hundreds THz is possible in principle.

It is also possible to create a bent camera.

Moreover, the 8-element array sensor 20 can be applied to sensing and medical application as a living body sensor and being attached on a human body by using its flexibility characteristic.

[Modification]

Figure 15A:
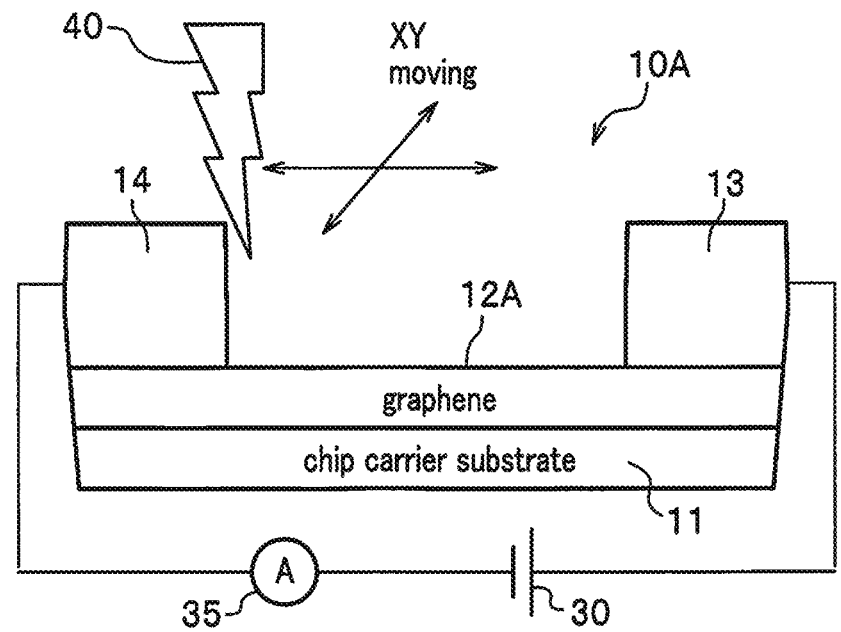
FIG. 15A is a diagram that illustrates a configuration of a modification of the terahertz wave detection device according to the embodiment.
Figure 15B:
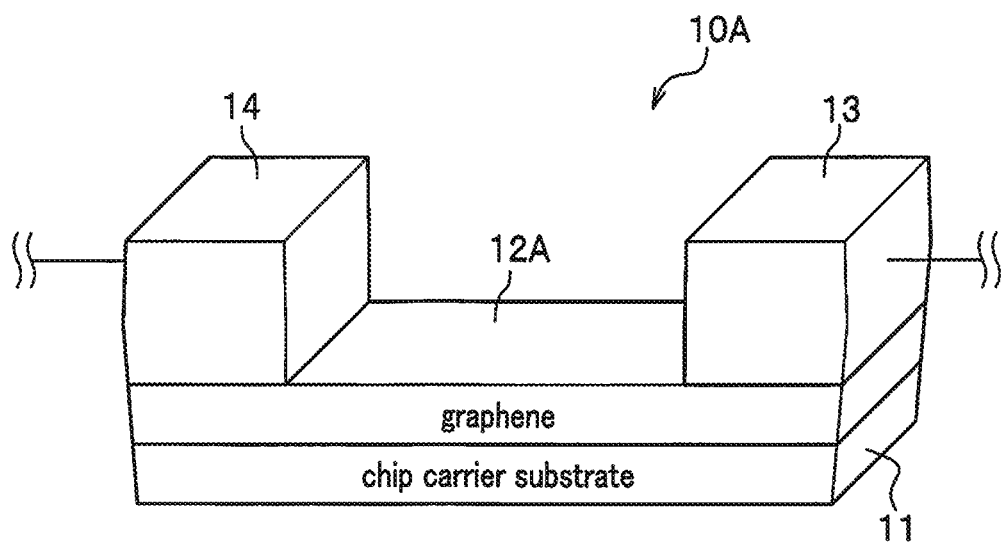
FIG. 15B is a perspective view of the terahertz wave detection device as the modification.

FIG. 15A is a diagram that illustrates a configuration of a modification of the terahertz wave detection device, and FIG. 15B is a perspective view of the terahertz wave detection device as the modification.

This modification is an example of using a graphene instead of the single-walled carbon nanotubes film.

As illustrated in FIGS. 15A and 15B, a terahertz wave detection element 10A includes a graphene 12A that is a two-dimensional system material and the first electrode 13 and the second electrode 14 opposingly arranged on a two-dimensional plane of the graphene 12A, in which the first electrode 13 and the second electrode 14 are made of metals having different thermal conductivity.

The graphene 12A is preferred to have multiple layers including two or more layers.

Likewise the single-walled carbon nanotubes film 12, the graphene 12A is appropriate for the low-dimensional electron system material of the terahertz wave detection device 10.

The graphene has a sheet structure with a single honeycomb atomic layer formed by $sp^2$ bonding of carbon atoms. The graphene has unique advantages such as high carrier mobility, optical wavelength independency (high transparency), and high optical non-linearity. The graphene is not limited to have a hexagonal cell structure merely made of the carbon atoms, and a certain kind of a substituent group/functional group may be linked to the hexagonal cell or otherwise a precursor such as an oxidized graphene may also exist. In this modification, the graphene 12A is two-dimensionally arranged on the chip carrier substrate 11. In addition, the graphene 12A may be a graphene with a single layer instead of a graphene with multiple layers.

The graphene has a cone band structure with no band gap and functions in any wavelength band with high carrier mobility and high transparency. This is preferable also in the context of a wavelength band of THz wave of the terahertz wave detection device 10A of this embodiment.

The low-dimensional electron system material other than the graphene may be a phosphorene (atomic layer black phosphorus) and a transition metal dichalcogenide ($MoS_2$, $WS_2$, $WSe_2$, and the like). Note that the phosphorene and the molybdenum disulphide ($MoS_2$) have characteristics of a semiconductor including a band gap and high carrier mobility. Taking consideration of easiness of creating, the graphene, $MoS_2$, and $WS_2$ are used in practice.

<Principle of Terahertz Wave Detection Element 10>

Next, a principle of the terahertz wave detection element (terahertz wave detection device) 10 is described.

The terahertz wave detection element 10 uses the photo-thermoelectric effect.

Figure 16:
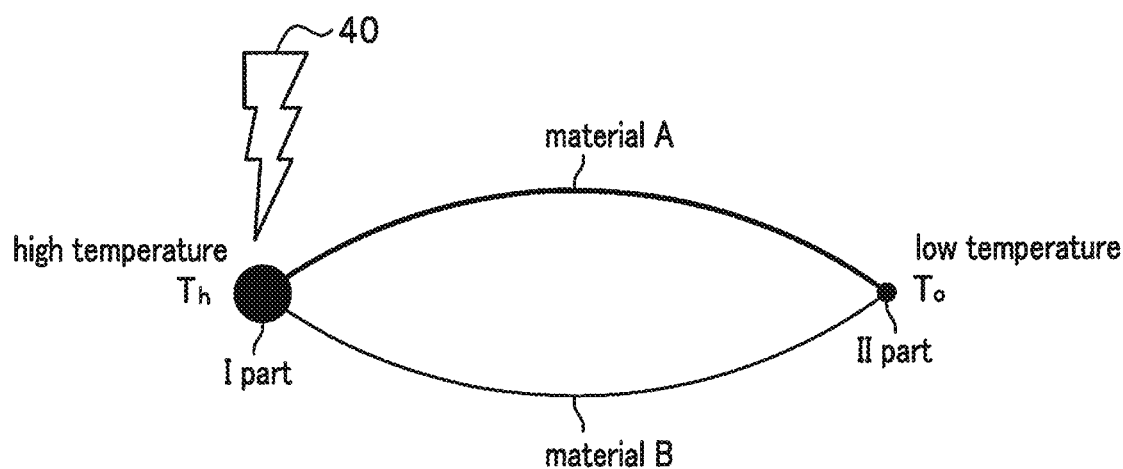
FIG. 16 is a schematic diagram that illustrates a principle of a terahertz wave detection element of the present invention.

FIG. 16 is a schematic diagram that illustrates the principle of the terahertz wave detection element of the present invention.

A material A and a material B are comparable to a single-walled carbon nanotubes film (CNT) and an electrode or a p-type CNT and a n-type CNT.

The material A and the material B contact with each other at a I part onto which the THz wave 40 of high temperature $T_h$ is radiated but do not contact with each other at a part away from the I part, which is the THz wave 40 irradiation part.

It is assumed that the THz wave 40 is radiated onto the I part at one end where the material A and the material B contact with each other.

Then, the I part absorbs the THz wave 40 and is heated to the high temperature $T_h$. Since a II part at the other end is away from the I part, temperature of the II part is low temperature $T_o$.

This generates a temperature difference between the I part and the II part, and the temperature gradient occurs.

Carriers are generated at the I part of the high temperature $T_h$, while on the other hand almost no carriers are generated at the II part of the low temperature $T_o$. Thus, density balance of the carriers is lost and the carriers flow from the I part to the II part. Once some amount of carriers move to the II part, moving of the carriers from the I part stops.

The I part from which the carriers move has a charge opposite to the carriers, and the II part to which the carriers move has a charge same with the carriers. This generates a potential difference between the I part and the II part (thermoelectric power V) and a current flows between the I part and the II part.

That is, heat (temperature gradient) is generated by absorption of the THz wave 40 into the single-walled carbon nanotubes film 12 (see FIG. 1A), and thus the potential difference (thermoelectric power V) occurs.

The thermoelectric power V is expressed by following Equation (1).

[Math. 1]

$$V=-S_{AB}(T_h-T_o)=-(S_A-S_B)(T_h-T_o) \qquad (1),\text{ where}$$

V: heat power
$S_{AB}$: relative Seebeck coefficient
$T_h$: temperature of I part
$T_o$: temperature of II part $S_A$ is a Seebeck coefficient of the material A and $S_B$ is a Seebeck coefficient of the material B.

Since the relative Seebeck coefficients $S_{AB}$ are expressed as ($S_A-S_B$) in Equation (1), the greater a difference between the Seebeck coefficient $S_A$ of the material A and the Seebeck coefficient $S_B$ of the material B, the greater the thermoelectric power V.

Equation (1) shows that the greater the temperature gradient ($T_h-T_o$), the greater the thermoelectric power V. Thus, the greater the thermal conductivity difference between the material A and the material B, the greater the temperature gradient ($T_h-T_o$), and the greater the thermoelectric power V.

In a case where the above-described relationship is applied to the terahertz wave detection element 10 illustrated in FIG. 1A, at the irradiation of the THz wave 40 on the single-walled carbon nanotubes film 12, temperature of the electrode close to the irradiation part of the single-walled carbon nanotubes film 12 (one of the first electrode 13 and the second electrode 14) becomes relatively high, and temperature of the electrode away from the irradiation part (the other one of the first electrode 13 and the second electrode 14) becomes relatively low.

In this case, when the first electrode 13 and the second electrode 14 are arranged as close as possible to each other for making the terahertz wave detection element 10 into a chip, since the first electrode 13 and the second electrode 14 made of the same kind of metal have the same thermal conductivity, the temperature difference between the first electrode 13 and the second electrode 14 is just about "0." This makes the thermoelectric power V be close to "0" and it is difficult to detect the terahertz wave.

On the other hand, when the first electrode 13 and the second electrode 14 are made of different kinds of metals, their thermal conductivity is different. Thus, when the first electrode 13 and the second electrode 14 are arranged as close as possible to each other, since their thermal conductivity is different, the temperature difference of the first electrode 13 and the second electrode 14 is greater than the case where they are made of the same kind of metal. This allows the generated thermoelectric power V to be greater than the case of the same kind of metal.

In other words, the case where the first electrode 13 and the second electrode 14 are made of different kinds of metals is more likely to be able to detect the THz wave 40 than the case of the same kind of metal.

That is, the greater the difference of the thermal conductivity between the first electrode 13 and the second electrode 14, the greater their temperature difference, and this allows much greater thermoelectric power V to be generated and higher sensitivity for detecting the THz wave 40 to be achieved.

<Respective Materials of First Electrode 13 and Second Electrode 14 of Terahertz Wave Detection Element 10 and THz Response>

An evaluation is made to see how the sensitivity of the terahertz wave detection element 10 changes depending on the difference of the thermal conductivity between the first electrode 13 and the second electrode 14.

Table 1 shows thermal conductivity of the metals Cu, Au, Al, Mo, Ni, and Ti used for the first electrode 13 and the second electrode 14.

TABLE 1

| Thermal Conductivity [W/(m · K)] | |
| --- | --- |
| Cu | 403 |
| Au | 318 |
| Al | 237 |
| Mo | 138 |
| Ni | 90.9 |
| Ti | 21.9 |

Table 2 shows combinations of the metals Cu, Au, Al, Mo, Ni, and Ti used for the first electrode 13 and the second electrode 14 and differences of the thermal conductivity (W/m·K) in each case.

TABLE 2

| | | First Electrode | | | | | |
| --- | --- | --- | --- | --- | --- | --- | --- |
| | | Cu | Au | Al | Mo | Ni | Ti |
| Second Electrode | Cu | 0 | 85 | 166 | 265 | 312.1 | 381.1 |
| | Au | 85 | 0 | 81 | 180 | 227.1 | 296.1 |
| | Al | 166 | 81 | 0 | 99 | 146.1 | 215.1 |
| | Mo | 265 | 180 | 99 | 0 | 47.1 | 116.1 |
| | Ni | 312.1 | 227.1 | 146.1 | 47.1 | 0 | 69 |
| | Ti | 318.1 | 296.1 | 215.1 | 116.1 | 69 | 0 |

According to Tables 1 and 2, among these metals, the combination of Cu and Ti has the greatest thermal conductivity difference that is 381.1 W/m·K.

The combination of Au—Ti has the second greatest thermal conductivity difference that is 296.1 W/m·K. For example, Au with the thermal conductivity of 318 W/m·K is used for the first electrode 13, and Ti with the thermal conductivity of 21.9 W/m·K is used for the second electrode 14.

Among these metals, the combination of Mo and Ni has the smallest thermal conductivity difference that is 47.1 W/m·K. For example, Mo with the thermal conductivity of 138 W/m·K is used for the first electrode 13, and Ni with the thermal conductivity of 90.9 W/m·K is used for the second electrode 14.

When the same metal is used, the thermal conductivity difference is "0." For example, this is the case where Al is used for both the first electrode 13 and the second electrode 14.

Figure 17:
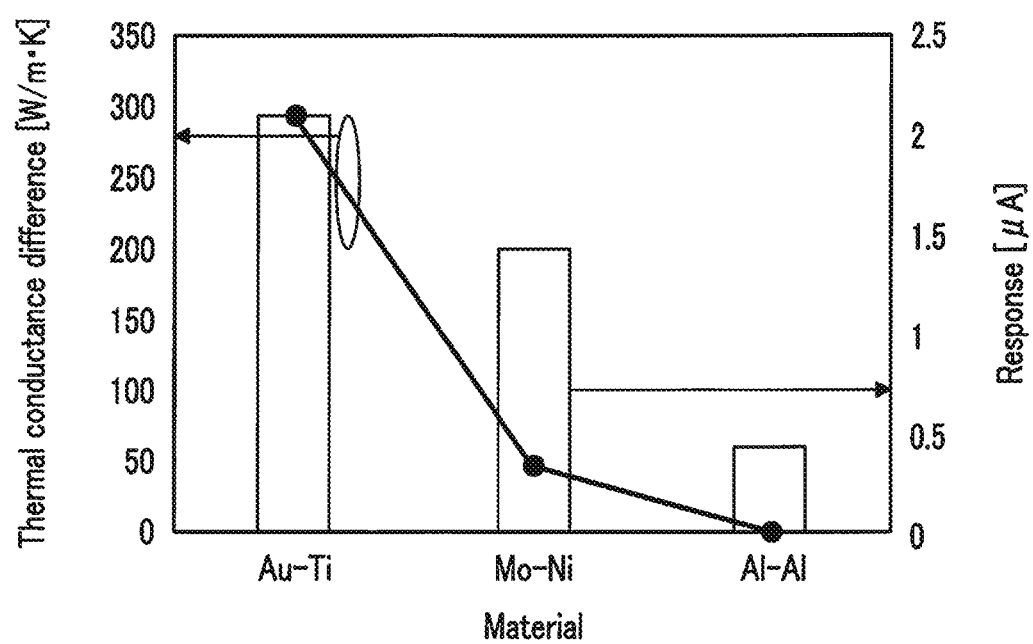
FIG. 17 is a diagram that illustrates thermal conductivity differences and THz responses of cases where the first electrode and the second electrode are applied with a combination of Au and Ti with a thermal conductivity difference of 296.1 W/m·K, a combination of Mo and Ni with a thermal conductivity difference of 47.1 W/m·K, and a combination of the same kind of metal Al with a thermal conductivity difference of 0.

FIG. 17 illustrates thermal conductivity differences (W/m·K) (left vertical axis) and THz responses (μA) (right vertical axis) of cases where the first electrode 13 and the second electrode 14 are applied with the combination of Au and Ti with the thermal conductivity difference of 296.1 W/m·K, the combination of Mo and Ni with the thermal conductivity difference of 47.1 W/m·K, and the combination of the same kind of metal Al with the thermal conductivity difference of 0. The thermal conductivity differences (W/m·K) (left vertical axis) are indicated by a line graph and the THz responses (μA) (right vertical axis) are indicated by a bar graph.

Evaluation conditions in FIG. 17 are a bundle size (bundle diameter) of 10 nm of the single-walled carbon nanotubes film 12, film thickness of 100 μm of the single-walled carbon nanotubes film 12, and each metal film thickness of 20 nm of the first electrode 13 and the second electrode 14. Note that the bundle diameter is a diameter of a group of multiple carbon nanotubes keeping their fiber forms.

According to FIG. 17, the combination of Au and Ti with the thermal conductivity difference of 296.1 W/m·K (left vertical axis) corresponds to the THz response of about 2 μA (right vertical axis). The combination of Mo and Ni with the thermal conductivity difference of 47.1 W/m·K (left vertical axis) corresponds to the THz response of about 1.5 μA (right vertical axis). The combination of the same kind of metal Al with the thermal conductivity difference of "0" (left vertical axis) corresponds to the THz response of about a little under 0.5 μA (right vertical axis).

According to the results illustrated in FIG. 17, it is confirmed that the greater the thermal conductivity difference between the first electrode 13 and the second electrode 14, the stronger the THz response, that is, the higher the sensitivity.

According to findings of the inventors and the like, the strength of the photothermoelectric power V is determined depending on various parameters such as the thermal conductivity of electrode metals, the electric conductivity, and the Seebeck coefficient. The conditions of this embodiment (100 μm thickness of the single-walled carbon nanotubes film and each metal film thickness of 20 nm of the first electrode 13 and the second electrode 14) are thought to be determined dominantly depending on the thermal conductivity.

As described above, in order to allow the terahertz wave detection element 10 to function, when downsizing the terahertz wave detection element 10 to create a small picture element, the thermal conductivity difference between the first electrode 13 and the second electrode 14 has to be a value that at least makes the value of the response signal other than 0. In other words, the thermal conductivity difference between the first electrode 13 and the second electrode 14 may at least be set to a value that allows the detection signal to be obtained when the THz wave 40 is radiated onto the single-walled carbon nanotubes film 12.

<Characteristics of Single-walled Carbon Nanotubes Film 12>

Next, characteristics of the single-walled carbon nanotubes film 12 (carbon nanotubes film) of the terahertz wave detection element 10 are described.

Figure 18:
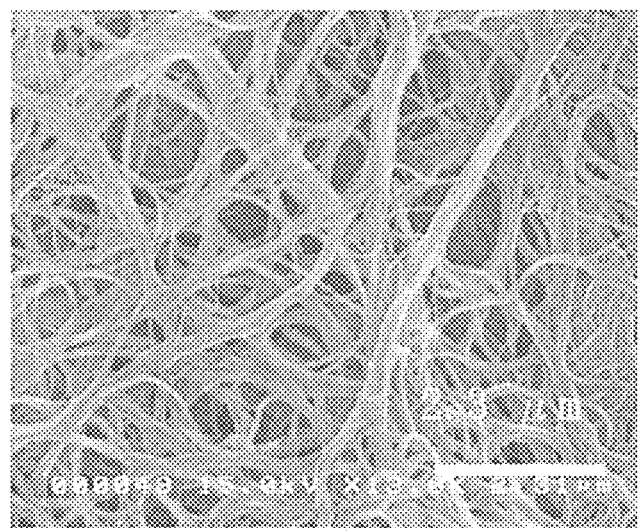
FIG. 18 is a magnified photograph of a single-walled carbon nanotubes film having a bundle diameter of about 10 nm.

FIG. 18 is a magnified photograph of the single-walled carbon nanotubes film 12 having a bundle diameter of about 10 nm. In FIG. 18, an object in a visible fiber form is the bundle.

Figure 19:
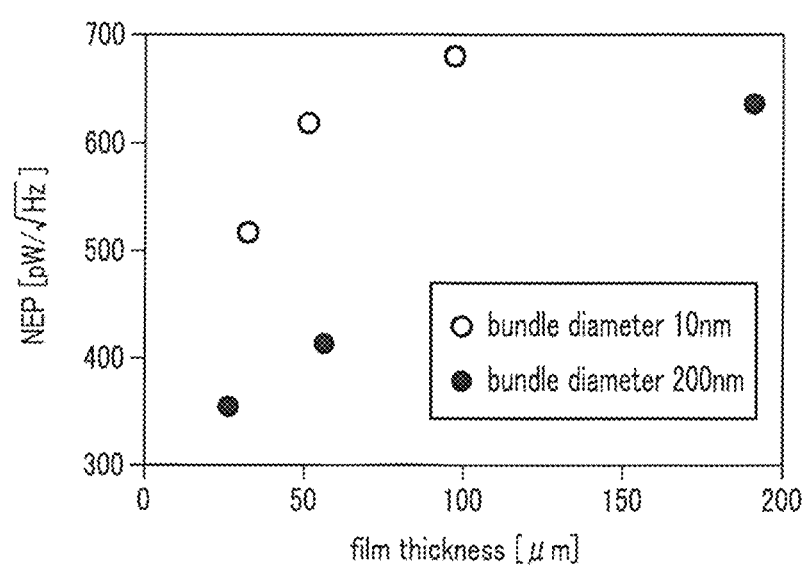
FIG. 19 is a diagram that illustrates a relationship of film thickness of the single-walled carbon nanotubes film and a noise equivalent power when a THz wave of 29 THz is radiated.

FIG. 19 is a diagram that illustrates a relationship of film thickness of the single-walled carbon nanotubes film 12 and a noise equivalent power (NEP) when the THz wave 40 of 29 THz is radiated. The horizontal axis represents the film thickness (μm), and the vertical axis represents the NEP (pW/√Hz). In FIG. 19, a black dot indicates a bundle diameter of about 200 nm and a white dot indicates a bundle diameter of about 10 nm. As described above, the bundle diameter is a diameter of a group of multiple carbon nanotubes keeping their fiber forms.

According to FIG. 19, it can be seen that the bundle diameter of about 200 nm has a higher NEP and higher sensitivity than the bundle diameter of about 10 nm in the single-walled carbon nanotubes film 12. The carbon nanotubes having a greater bundle diameter has better orientation than that having a smaller bundle diameter.

The characteristics of the carbon nanotube fibers are likely to remain in the single-walled carbon nanotubes film 12 (carbon nanotubes film) with a greater bundle diameter.

Fibers of the carbon nanotube have a great Seebeck coefficient. Thus, the single-walled carbon nanotubes film 12 (carbon nanotubes film) with a greater bundle diameter is sensitive.

Therefore, the single-walled carbon nanotubes film 12 is preferred to be oriented with a great bundle diameter to the extent possible, which is about 500 nm.

If the NEP indicated in FIG. 19 has sensitivity of equal to or lower than 700 pW/√Hz, the characteristics of the terahertz wave detection element 10 can be satisfied at least.

Other Embodiments

1. The above-described embodiments describe a case where the single-walled carbon nanotubes film 12 is formed on the chip carrier substrate 11; however, the terahertz wave detection element 10 may be made without providing the chip carrier substrate 11.

2. The above-described embodiments describe a case where the film of the single-walled carbon nanotubes film 12 is used as the low-dimensional electron system material as an example; however, a single-walled carbon nanotube, a double-walled carbon nanotube, and a multi-walled carbon nanotube may be used either independently or together. A single-walled graphene or a multi-walled graphene may also be used as the low-dimensional electron system material.

3. The above-described embodiments describe a case where the first electrode 13 and the second electrode 14 are metals as an example; however, as long as the functions of the electrodes can be achieved, a material other than metals may be used.

The present invention is not limited to the above-described embodiments and includes another modification and application example without departing from a gist of the present invention stated in the claims.

In addition, the above examples are described in detail for clear explanation and are not necessarily limited for an embodiment including all the configurations described above. A part of a configuration of one example can be replaced with a configuration of another example, and also a configuration of the other example can be added to a configuration of the one example. A part of a configuration of each example can be added with or deleted to be replaced with the other configuration.

Moreover, the above-described embodiments use a name of terahertz wave detection device; however, this is for the sake of convenience and the name may be terahertz wave detection unit or the like.

REFERENCE SIGNS LIST

10, 10A terahertz wave detection element (terahertz wave detection device)
11 chip carrier substrate
12 single-walled carbon nanotubes film (low-dimensional electron system material, carbon nanotubes film)
12A graphene (low-dimensional electron system material)
13 first electrode
14 second electrode
20 8-element array sensor
40 THz wave
50 metal mask
70 23-element array sensor
71 flexible board
80 bent mask

What is claimed is:

1. A terahertz wave detection device comprising:
   a low-dimensional electron system material formed on a substrate; and
   a first electrode and a second electrode opposingly arranged on a two-dimensional plane of the low-dimensional electron system material,
   wherein the first electrode and the second electrode are made of metals having different thermal conductivity.

2. The terahertz wave detection device according to claim 1,
   wherein a difference between conductivity of the first electrode and conductivity of the second electrode is a predetermined value or more.

3. The terahertz wave detection device according to claim 1,
   wherein the low-dimensional electron system material is a carbon nanotube accurately oriented in a two-dimensional direction of the two-dimensional plane.

4. The terahertz wave detection device according to claim 3,
   wherein the carbon nanotube has a single layer.

5. The terahertz wave detection device according to claim 1,
   wherein the low-dimensional electron system material is a graphene having a single layer or plural layers.

6. An array sensor comprising:
   terahertz wave detection devices according to claim 1 aligned in an array,
   wherein the array sensor radiates a THz wave onto a surface of the low-dimensional electron system material and detects carriers that are THz excited in the low-dimensional electron system material.

7. The terahertz wave detection device according to claim 1,
   wherein a thermal conductivity difference between the first electrode and the second electrode is a value obtained as a detection signal while a terahertz wave is radiated onto the low dimensional electron system material.

8. The terahertz wave detection device according to any one of claim 1,
wherein an NEP between the first electrode and the second electrode is 700 pW/√Hz or less.

9. The terahertz wave detection device comprising:
a carbon nanotube film;
a first electrode disposed on one side of the carbon nanotube film; and
a second electrode disposed on the other side of the carbon nanotube film,
wherein the first electrode and the second electrode have different thermal conductivity.

10. The terahertz wave detection device according to claim 9,
wherein an NEP between the first electrode and the second electrode is 700 pW/√Hz or less.

* * * * *